US006306564B1

(12) United States Patent
Mullee

(10) Patent No.: US 6,306,564 B1
(45) Date of Patent: Oct. 23, 2001

(54) REMOVAL OF RESIST OR RESIDUE FROM SEMICONDUCTORS USING SUPERCRITICAL CARBON DIOXIDE

(75) Inventor: William H. Mullee, Portland, OR (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 09/085,391

(22) Filed: May 27, 1998

Related U.S. Application Data

(60) Provisional application No. 60/047,739, filed on May 27, 1997.

(51) Int. Cl.[7] ............................................. G03F 7/42
(52) U.S. Cl. ............................................. 430/329; 134/1.3
(58) Field of Search ............................... 430/329, 330; 134/1, 1.3

(56) References Cited

U.S. PATENT DOCUMENTS

| | | | |
|---|---|---|---|
| 2,617,719 | 11/1952 | Stewart | 23/312 |
| 3,890,176 | 6/1975 | Bolon | 156/2 |
| 3,900,551 | 8/1975 | Bardoncelli et al. | 423/9 |
| 4,029,517 | 6/1977 | Rand | 134/11 |
| 4,091,643 | 5/1978 | Zucchini | 68/18 |
| 4,341,592 | 7/1982 | Shortes et al. | 156/643 |
| 4,474,199 | 10/1984 | Blaudszun | 134/105 |
| 4,475,993 | 10/1984 | Blander et al. | 204/64 T |
| 4,601,181 | 7/1986 | Privat | 68/18 |
| 4,693,777 | 9/1987 | Hazano et al. | 156/345 |
| 4,749,440 | 6/1988 | Blackwood et al. | 156/646 |
| 4,788,043 | 11/1988 | Kagiyama et al. | 422/292 |
| 4,838,476 | 6/1989 | Rahn | 228/180.1 |
| 4,865,061 | 9/1989 | Fowler et al. | 134/108 |
| 4,879,004 | 11/1989 | Oesch et al. | 203/89 |
| 4,923,828 | 5/1990 | Gluck et al. | 437/225 |
| 4,924,892 | 5/1990 | Kiba et al. | 134/123 |
| 4,944,837 | * 7/1990 | Nishikawa | 430/329 |
| 4,960,140 | 10/1990 | Ishijima et al. | 134/31 |
| 4,983,223 | 1/1991 | Gessner | 134/25.4 |
| 5,011,542 | 4/1991 | Weil | 134/38 |
| 5,013,366 | 5/1991 | Jackson et al. | 134/1 |
| 5,068,040 | 11/1991 | Jackson | 210/748 |

(List continued on next page.)

FOREIGN PATENT DOCUMENTS

| | | |
|---|---|---|
| 0 283 740 A2 | 9/1988 | (EP) . |
| 0 391 035 | 10/1990 | (EP) ............. C23G/5/00 |
| 0 536 752 A2 | 4/1993 | (EP) ............. C11D/3/20 |
| 0 572 913 A1 | 12/1993 | (EP) ............. B01D/11/02 |
| 0 726 099 A2 | 8/1996 | (EP) ............. B08B/5/00 |
| 60-192333 | 9/1985 | (JP) . |
| 60192333 | 9/1985 | (JP) . |
| 1045131 | 2/1989 | (JP) . |
| WO 90/06189 | 6/1990 | (WO) . |
| WO 90/13675 | 11/1990 | (WO) . |

OTHER PUBLICATIONS

Guan, Z. et al., "Fluorocarbon–Based Heterophase Polymeric Materials. 1. Block Copolymer Surfactants for Carbon Dioxide Applications," Macromolecules, vol. 27, 1994, pp 5527–5532.

(List continued on next page.)

Primary Examiner—Kathleen Duda
(74) Attorney, Agent, or Firm—Haverstock & Owens LLP

(57) ABSTRACT

A commercially available solvent, such as a stripping chemical and/or an organic solvent, is supported by supercritical $CO_2$ to remove a resist, its residue, and/or an organic contaminant off the surface of a semiconductor wafer. Supercritical $CO_2$ has a high solvency which increases with pressure. The supercritical $CO_2$ permits a tremendous reduction in reaction time and amount of chemical utilized for the resist removal process. In a preferred embodiment, the wafer is exposed to the $CO_2$ and chemical mixture in a process chamber heated to a temperature of 20 to 80° C. at a pressure of 1050 to 6000 psig for a period of 10 seconds to 15 minutes.

57 Claims, 4 Drawing Sheets

U.S. PATENT DOCUMENTS

| | | | |
|---|---|---|---|
| 5,105,556 | 4/1992 | Kurokawa et al. | 34/12 |
| 5,143,103 | 9/1992 | Basso et al. | 134/98.1 |
| 5,158,704 | 10/1992 | Fulton et al. | 252/309 |
| 5,174,917 | 12/1992 | Monzyk | 252/60 |
| 5,185,058 | 2/1993 | Cathey, Jr. | 156/656 |
| 5,185,296 | 2/1993 | Morita et al. | 437/229 |
| 5,193,560 | 3/1993 | Tanaka et al. | 134/56 R |
| 5,213,619 | 5/1993 | Jackson et al. | 134/1 |
| 5,215,592 | 6/1993 | Jackson | 134/1 |
| 5,225,173 | 7/1993 | Wai | 423/2 |
| 5,236,602 | 8/1993 | Jackson | 210/748 |
| 5,237,824 | 8/1993 | Pawliszyn | 62/51.1 |
| 5,261,965 | 11/1993 | Moslehi | 134/1 |
| 5,266,205 | 11/1993 | Fulton et al. | 210/639 |
| 5,267,455 | 12/1993 | Dewees et al. | 68/5 |
| 5,274,129 | 12/1993 | Natale et al. | 549/349 |
| 5,288,333 | 2/1994 | Tanaka et al. | 134/31 |
| 5,290,361 | 3/1994 | Hayashida et al. | 134/2 |
| 5,294,261 | 3/1994 | McDermott et al. | 134/7 |
| 5,304,515 | 4/1994 | Morita et al. | 437/231 |
| 5,306,350 | 4/1994 | Hoy et al. | 134/22.14 |
| 5,313,965 | 5/1994 | Palen | 134/61 |
| 5,316,591 | 5/1994 | Chao et al. | 134/34 |
| 5,334,332 | 8/1994 | Lee | 252/548 |
| 5,334,493 | 8/1994 | Fujita et al. | 430/463 |
| 5,337,446 | 8/1994 | Smith et al. | 15/21.1 |
| 5,352,327 | 10/1994 | Witowski | 156/646 |
| 5,355,901 | 10/1994 | Mielnik et al. | 134/105 |
| 5,356,538 | 10/1994 | Wai et al. | 210/634 |
| 5,368,171 | 11/1994 | Jackson | 134/147 |
| 5,370,740 | 12/1994 | Chao et al. | 134/1 |
| 5,377,705 | 1/1995 | Smith, Jr. et al. | 134/95.3 |
| 5,401,322 | 3/1995 | Marshall | 134/13 |
| 5,403,621 | 4/1995 | Jackson et al. | 427/255.1 |
| 5,417,768 | 5/1995 | Smith, Jr. et al. | 134/10 |
| 5,456,759 | 10/1995 | Stanford et al. | 134/1 |
| 5,470,393 | 11/1995 | Fukazawa | 134/3 |
| 5,482,564 | 1/1996 | Douglas et al. | 134/18 |
| 5,494,526 | 2/1996 | Paranjpe | 134/1 |
| 5,500,081 | 3/1996 | Bergman | 156/646.1 |
| 5,501,761 | 3/1996 | Evans et al. | 156/344 |
| 5,514,220 | 5/1996 | Wetmore et al. | 134/22.18 |
| 5,522,938 | 6/1996 | O'Brien | 134/1 |
| 5,526,834 | 6/1996 | Mielnik et al. | 134/105 |
| 5,533,538 | 7/1996 | Marshall | 134/104.4 |
| 5,547,774 | 8/1996 | Gimzewski et al. | 428/694 |
| 5,550,211 | 8/1996 | DeCrosta et al. | 528/480 |
| 5,580,846 | 12/1996 | Hayashida et al. | 510/175 |
| 5,589,105 | 12/1996 | DeSimone et al. | 252/351 |
| 5,632,847 | 5/1997 | Ohno et al. | 156/344 |
| 5,635,463 | 6/1997 | Muraoka | 510/175 |
| 5,637,151 | 6/1997 | Schulz | 134/2 |
| 5,641,887 | 6/1997 | Beckman et al. | 546/26.2 |
| 5,656,097 | 8/1997 | Olesen et al. | 134/1 |
| 5,665,527 | 9/1997 | Allen et al. | 430/325 |
| 5,679,169 | 10/1997 | Gonzales et al. | 134/1.3 |
| 5,679,171 | 10/1997 | Saga et al. | 134/3 |
| 5,683,977 | 11/1997 | Jureller et al. | 510/286 |
| 5,688,879 | 11/1997 | DeSimone | 526/89 |
| 5,700,379 | 12/1997 | Biebl | 216/2 |
| 5,726,211 | 3/1998 | Hedrick et al. | 521/61 |
| 5,739,223 | 4/1998 | DeSimone | 526/89 |
| 5,783,082 | 7/1998 | DeSimone et al. | 210/634 |
| 5,798,438 | 8/1998 | Sawan et al. | 528/483 |
| 5,804,607 | 9/1998 | Hedrick et al. | 521/64 |
| 5,868,856 | 2/1999 | Douglas et al. | 134/2 |
| 5,868,862 | 2/1999 | Douglas et al. | 134/26 |
| 5,872,257 | 2/1999 | Beckman et al. | 546/336 |
| 5,873,948 | 2/1999 | Kim | 134/19 |
| 5,881,577 | 3/1999 | Sauer et al. | 68/5 |
| 5,908,510 | 6/1999 | McCullough et al. | 134/2 |
| 5,944,996 | 8/1999 | DeSimone et al. | 210/634 |
| 5,980,648 | 11/1999 | Adler | 134/34 |
| 6,024,801 | 2/2000 | Wallace et al. | 134/1 |

OTHER PUBLICATIONS

International Journal of Environmentally Conscious Design & Manufacturing, vol. 2, No. 1, 1993, p. 83.

Journal of the American Ceramic Society, vol. 72, No. 6, pp. 872–874.

Ziger, D.H. et al., "Compressed Fluid Technolgy: Application to RIE Developed Resists," AIChE Journal, vol. 33, No. 10, Oct. 1987, pp 1585–1591.

Kirk–Othmer, "Encyclopedia of Chemical Terminology," 3rd ed., Supplement Volume, "Alcohol Fuels to Toxicology," 1984, pp. 872–893.

"Cleaning with Supercritical $CO_2$," NASA Tech Briefs, MFS–29611, Marshall Space Flight Center, Alabama, Mar. 1979.

Takahashi, Dean, "Los Alamos Lab Finds Way to Cut Chip Toxic Waste," *Wall Street Journal*, Jun. 22, 1998.

"Supercritical $CO_2$ process offers less mess from semiconductor plants," *Chemical Engineering Magazine*, pp. 27 and 29, Jul. 1998 ed.

Buhler, J. et al., Liner array of complementary metal oxide semiconductor double–pass metal micromirrors, Opt. Eng., vol. 36, No. 5, pp 1391–1398, May 1997.

Jo, M.H. et al., Evaluation of $SiO_2$ aerogel thin film with ultra low dielectric constant as an intermetal dielectric, Microelectronic Engineering, vol. 33, pp 343–348, Jan. 1997.

Znaidi, L. et al., "Batch and semi–continuous synthesis of magnesium oxide powders from hydrolysis and supercritical treatment of $Mg(OCH_3)_2$," Materials Research Bulletin, vol. 31, No. 12, pp 1527–1535, Dec. 1996.

Tadros, M.E., "Synthesis of titanium dioxide particles in supercritical $CO_2$," J. Supercritical Fluids, vol. 9, No. 3, pp 172–176, Sep. 1996.

Courtecuisse, V.G. et al., "Kinetics of the titanium isopropoxide decomposition in supercritical isopropyl alcohol," Ind. Eng. Chem. Res., vol. 35, No. 8, pp 2539–2545, Aug. 1996.

Schimek, G.L. et al., "Supercritical ammonium synthesis and characterization of four new alkali metal silver antimony sulfides . . . ," J. Solid State Chemistry, vol. 123, pp 277–284, May 1996.

Papathomas, K.I. et al., "Debonding of photoresists by organic solvents," J. Applied Polymer Science, vol. 59, pp 2029–2037, Mar. 28, 1996.

Watkins, J.J. et al., "Polymer/metal nanocomposite synthesis in supercritical $CO_2$," Chemistry of Materials, vol. 7, No. 11, Nov. 1995.

Gloyna, E.F. et al., "Supercritical water oxidation research and development update," Environmental Progress, vol. 14, No. 3, pp 182–192.

Gabor, A.H. et al., "Silicon–containing block copolymer resist materials," Microelectronics Technology—Polymers for Advanced Imaging and Packaging, ACS Symposium Series, vol. 614, pp 281–298, Apr. 1996.

Tsiartas, P.C. et al., "Effect of molecular weight distribution on the dissolution properties of novolac blends," SPIE, vol. 2438, pp 261–271, 1995.

Allen, R.D. et al., "Performance properties of near–monodisperse novolak resins," SPIE, vol. 2438, pp 250–260, 1995.

Wood, P.T. et al., "Synthesis of new channeled structures in supercritical amines . . . ," Inorg. Chem., vol. 33, pp 1556–1558, 1994.

Jerome, J.E. et al., "Synthesis of new low–dimensional quaternary compounds . . . ," Inorg. Chem., vol. 33, pp 1733–1734, 1994.

McHardy, J. et al., "Progress in supercritical $CO_2$ cleaning," SAMPE Jour., vol. 29, No. 5, pp 20–27, Sep. 1993.

Purtell, R. et al., "Precision parts cleaning using supercritical fluids," J. Vac. Sci. Technol. A, vol. 11, No. 4, Jul. 1993.

Bok, E. et al., "Supercritical fluids for single wafer cleaning," Solid State Technology, pp 117–120, Jun. 1992.

Adschiri, T. et al., "Rapid and continuous hydrothermal crystallization of metal oxide particles in supercritical water," J. Am. Ceram. Soc., vol. 75, No. 4, pp 1019–1022, 1992.

Hansen, B.N. et al., "Supercritical fluid transport—chemical deposition of films," Chem. Mater., vol. 4, No. 4, pp 749–752, 1992.

Page, S.H. et al., "Predictability and effect of phase behavior of $CO_2$/propylene carbonate in supercritical fluid chromatography," J. Microl. Sep, vol. 3, No. 4, pp 355–369, 1991.

Brokamp, T. et al., "Synthese und Kristallstruktur eines gemischtvalenten Lithium—Tantalnirids $Li_2Ta_3N_5$," J. Alloys and Compounds, vol. 176, pp 47–60, 1991.

Hybertson, B.M. et al., "Deposition of palladium films by a novel supercritical fluid transport–chemical deposition process," Mat. Res. Bull., vol. 26, pp 1127–1133, 1991.

Ziger, D.H. et al., "Compressed fluid technology: Application to RIE–developed resists," AIChE Jour., vol. 33, No. 10, pp 1585–1591, Oct. 1987.

Matson, D.W. et al., "Rapid expansion of supercritical fluid solutions: Solute formation of powders, thin films, and fibers," Ind. Eng. Chem. Res., vol. 26, No. 11, pp 2298–2306, 1987.

Tolley, W.K. et al., "Stripping organics from metal and mineral surfaces using supercritical fluids," Separation Science and Technology, vol. 22, pp 1087–1101, 1987.

"Final report on the safety assessment of propylene carbonate," J. American College of Toxicology, vol. 6, No. 1, pp 23–51.

McClain, J.B., et al., "Design of Nonionic Surfactants for Supercritical Carbon Dioxide," Science, vol. 27, Dec. 20, 1996, pp. 2049–2052.

Derwent WPI, English Abstract of Japanese patent application No. 8222508, published Aug. 30, 1996.

Sun, Y.P. et al., "Preparation of polymer–protected semiconductor nanoparticles through the rapid expansion of supercritical fluid solution," Chemical Physics Letters, pp 585–588, May 22, 1998.

Jackson, K. et al., "Surfactants and Microemulsions in Supercritical Fluids," in "Supercritical Fluid Cleaning." Noyes Publications, Westwood, NJ, pp 87–120, Spring 1998.

Kryszewski, M., "Production of Metal and Semiconductor Nanoparticles in Polymer Systems," Polymeri, pp 65–73, Feb. 1998.

Bakker, G.L. et al., "Surface Cleaning and Carbonaceous Film Removal Using High Pressure, High Temperature Water, and Water/$CO_2$ Mixtures," J. Electrochem. Soc, vol. 145, No. 1, pp 284–291, Jan. 1998.

Ober, C.K. et al., "Imaging polymers with supercritical carbon dioxide," Advanced Materials, vol. 9, No. 13, pp 1039–1043, Nov. 3, 1997.

Russick, E.M. et al., "Supercritical carbon dioxide extraction of solvent from micromachined structures," Supercritical Fluids—Extraction and Pollution Prevention, ACS Symposium Series, vol. 670, pp. 255–269, Oct. 21, 1997.

Dahmen, N. et al., "Supercritical fluid extraction of grinding and metal cutting waste contaminated with oils," Supercritical Fluids—Extraction and Pollution Prevention, ACS Symposium Series, vol. 670, pp 270–279, Oct. 21, 1997.

Wai, C.M., "Supercritical fluid extraction: metals as complexes," J. Chromatography A, vol. 785, pp 369–383, Oct. 17, 1997.

Xu, C. et al., Submicron –sized spherical yttrium oxide based phosphors prepared by supercritical $CO_2$–assisted aerosolization and pyrolysis, Appl. Phys. Lett., vol. 71, No. 12, Sep. 22, 1997.

Tomioka, Y. et al., "Decomposition of tetramethylammonium (TMA) in a positive photoresist developer by supercritical water," Abstracts of Papers 214th ACS Natl Meeting, American Chemical Society, Abstract No. 108, Sep. 7, 1997.

Klein, H. et al., "Cyclic organic carbonates serve as solvents and reactive diluents," Coatings World, pp 38–40, May 1997.

Derwent WPI, English abstract of Japanese patent application No. 7142333, published Jun. 2, 1995.

Derwent WPI, English abstract of European patent No. 727711, published Feb. 13, 1996.

Gallagher–Wetmore, Paula, "Supercritical Fluid Processing: A New Dry Technique for Photoresist Developing", IBM Research Division, SPIR vol. 2438, pp 694–708 (6/95).

Gallagher–Wetmore, Paula, "Supercritical Fluid Processing: Opportunities for New Resist Materials and Processes", IBM Research Division, SPIE vol. 2725, pp 289–299 (4/96).

Gabor, Allen, Gallagher–Wetmore, and Ober, "Block and Random Copolymer Resists Designed for 193 nm Lithography and Environmentally Friendly Supercritical $CO_2$ Development", Dept. of Materials Sci. & Eng., Cornell Univ., SPIE vol. 2724, pp 410–417 (6/96).

* cited by examiner

| SAMPLE NO. | RESIST MATERIAL | DEPTH ON 8" WAFER (μm) | FEATURE SIZE (μm) | TEMP. (°C) | PRESSURE (PSIG) | CHEMICAL (S) I | TIME I (SEC.) | CHEMICAL (S) II | TIME II (SEC.) |
|---|---|---|---|---|---|---|---|---|---|
| 1 | NOVOLACK-BASED | 0.1 to 0.5 | 0.25 DIAMETER, 2.0 DEPTH | 60 | 3500 | 1 mL MIXTURE OF A TERTIARY AMINE-BASED STRIPPER WITH A KELATING AGENT AND IPA | 120 | 2 mL IPA | 30 |
| 2 | NOVOLACK-BASED | 0.1 to 0.5 | 0.25 DIAMETER, 2.0 DEPTH | 60 | 3500 | 1 mL MIXTURE OF A 3 TO 6 CARBON DIONE AND NMP | 60 | 2 mL IPA | 30 |
| 3 | NOVOLACK-BASED | 0.1 to 0.5 | 0.25 DIAMETER, 2.0 DEPTH | 60 | 3500 | 1 mL MIXTURE OF A 3 TO 6 CARBON DIONE, NMP, AND DMSO | 30 | 1 mL IPA | 30 |

Fig. 5

REMOVAL OF RESIST OR RESIDUE FROM SEMICONDUCTORS USING SUPERCRITICAL CARBON DIOXIDE

This patent application derives priority from provisional application No. 60/047,739, filed May 27, 1997.

TECHNICAL FIELD

This invention relates to stripping semiconductor wafers and, in particular, to using a chemical, such as organic and/or inorganic stripping solvent(s), supported by supercritical $CO_2$ to remove resist material, such as photoresist, its residue, and/or an organic contaminant, from the surface of semiconductor device on the wafer.

BACKGROUND OF THE INVENTION

The manufacture of semiconductor devices typically requires the application and subsequent removal of photoresist from the top surface of a semiconductor wafer. The removal of photoresist, commonly called "stripping," may be immediately preceded by a plasma ashing, etching, or other semiconductor manufacturing step. These steps can degrade or carbonize the photoresist and leave a photoresist residue that is difficult to remove by current stripping methods. A conventional stripping practice requires wafers to be dipped into baths of commercially available chemical mixtures known as "strippers." These baths may employ heat and/or ultrasonic augmentation and typically require immersion times of twenty to thirty minutes to achieve complete removal of photoresist or its residue from the wafer surface.

SUMMARY OF THE INVENTION

An object of the present invention is, therefore, to provide a more efficient process for removing resist, its residue, or organic contaminants from wafers.

Another object of the present invention is to provide such a process that reduces the reaction time and the amount of chemicals used to remove resist.

In the present invention, supercritical $CO_2$ carries organic and/or inorganic chemicals into a heated and pressurized wafer chamber; interacts with resist, resist residues, and organic contaminants on the wafer surface; and carries these materials and remaining chemicals out of the chamber. Supercritical carbon dioxide ($CO_2$) has a high solubilizing power and has been exploited in a variety of applications, such as for cleaning metal parts. The high solvency characteristics of supercritical $CO_2$ can assist in the process of stripping resist, its residue, or organic contaminants from the surfaces of semiconductor wafers. Because the diffusivity and viscosity of $CO_2$ at or above its supercritical point is similar to those of its gas phase, and because the density of supercritical $CO_2$ is nearly equal to that of its liquid state, supercritical $CO_2$ characteristics are ideal for bringing small amounts of chemicals into contact with submicron surface features of semiconductor devices. Since the solvency of supercritical $CO_2$ also increases with pressure, the invention permits a significantly smaller fraction of chemicals to effect the stripping process as compared to amounts of stripping chemicals required by prior art systems.

Additional objects and advantages of this invention will be apparent from the following detailed description of preferred embodiments thereof which proceeds with reference to the accompanying drawings.

BRIEF DESCRIPTION OF THE DRAWINGS

FIG. 5 presents a table showing a few examples of tests performed to remove photoresist from a wafer.

DETAILED DESCRIPTION OF PREFERRED EMBODIMENT

Figure 1:
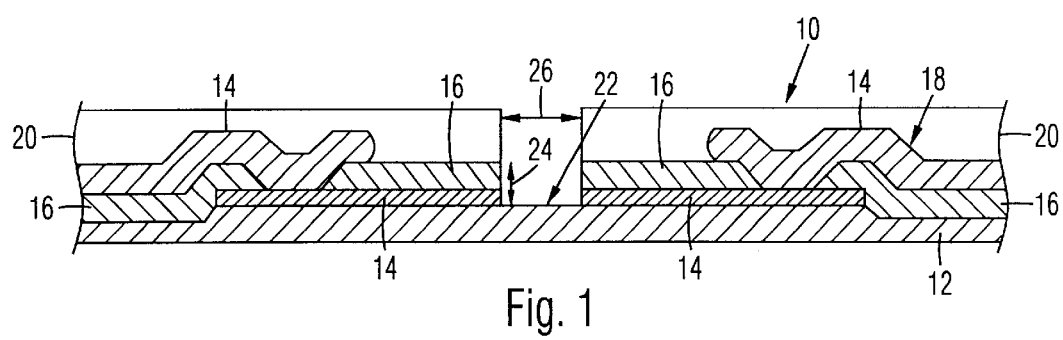
FIG. 1 is a fragmentary cross-sectional view of a preprocessed semiconductor wafer supporting several material layers.

FIG. 1 is a fragmentary cross-sectional view of a preprocessed semiconductor wafer 10 supporting a variety of layers. With reference to FIG. 1, semiconductor wafer 10 typically comprises a silicon or ceramic substrate 12 that supports one or more metallic layers 14 that may be protected by one or more alternating passivation or other layers 16. Layers 14 and 16 form an elevationally varied surface 18 that is typically covered with a resist layer 20 and subjected to a photolithographic process to create features 22 (not shown to scale). Conventional features 22, such as vias, line widths, or pitches, may be as small as 0.25 μm and smaller with aspect ratios of depth 24 to width 26 that are greater than 5:1 or greater than or equal to 10:1.

In accordance with the present invention, resist layer 20 may be a remnant from a prior lithographic or other circuit fabrication process and may have subsequently undergone etching, plasma ashing, or semiconductor manufacturing steps. The resist may, therefore, include sidewall polymer residue or carbonaceous residue left after any of these techniques. Alternatively resist layer 20 may be newly applied to protect layers 14 and 16 during a processing operation on the back side of wafer 10, such as during marking, etching, or grinding or as a blanket protection during ion implantation. Thus, skilled persons will appreciate that wafer 10 may be partly or completely covered with a resist material, resist residue, or a contaminant from a subsequent process. The resist material is typically a positive or negative photoresist used for a photolithographic process. Photoresist materials include, but are not limited to, Novolak (M-Cresol formaldehyde) or etch-resistant poly coatings such as poly isoprene, poly-(methyl isopropenyl ketone) (PMIPK), or polymethyl methacrylate (PMMA). The resist material need not be a photoresist and may comprise any form of resist material with or without photosensitizers.

Figure 2:
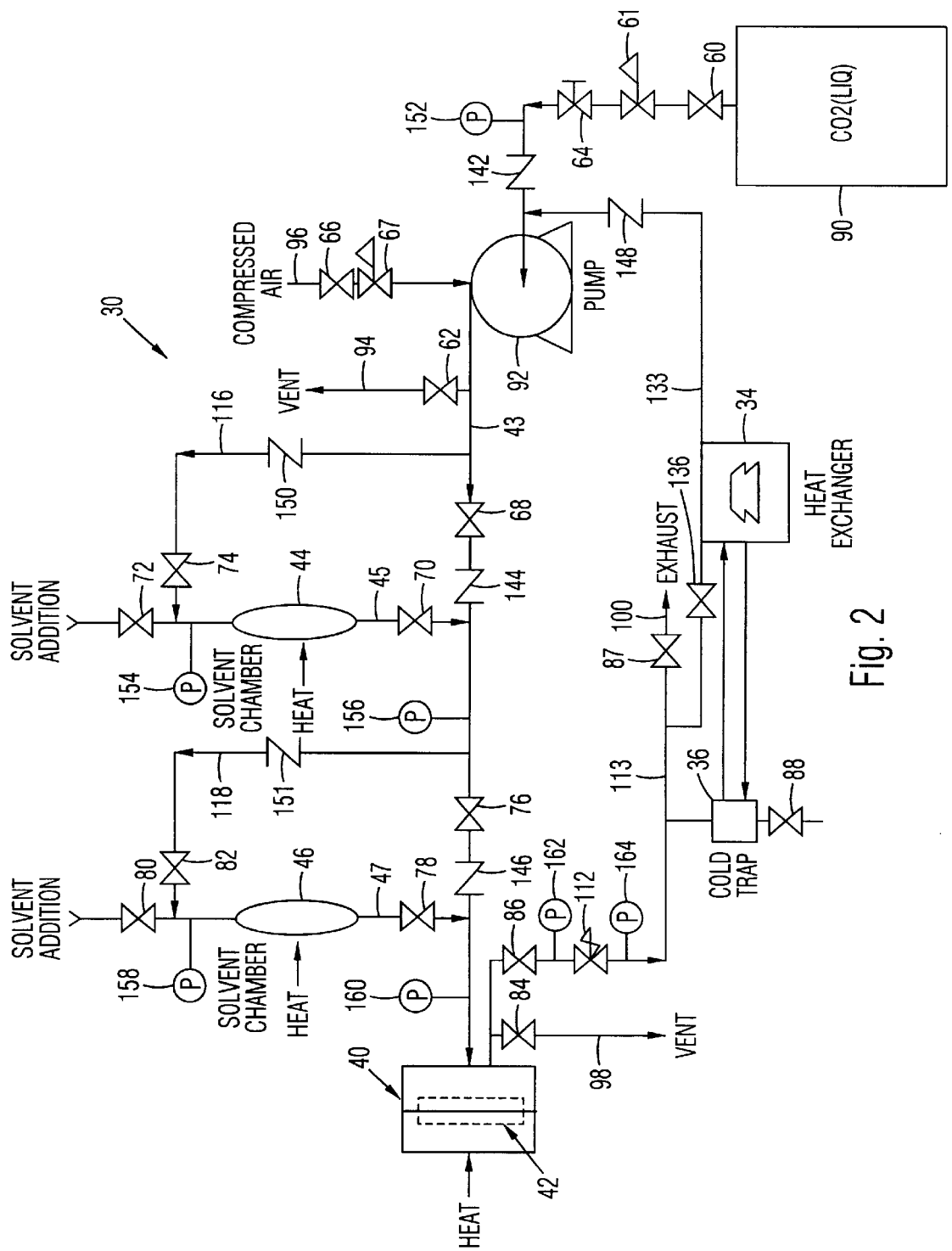
FIG. 2 is a schematic diagram showing chambers, pipes, and valves of a simplified resist removal system in accordance with the present invention.
Figure 3:
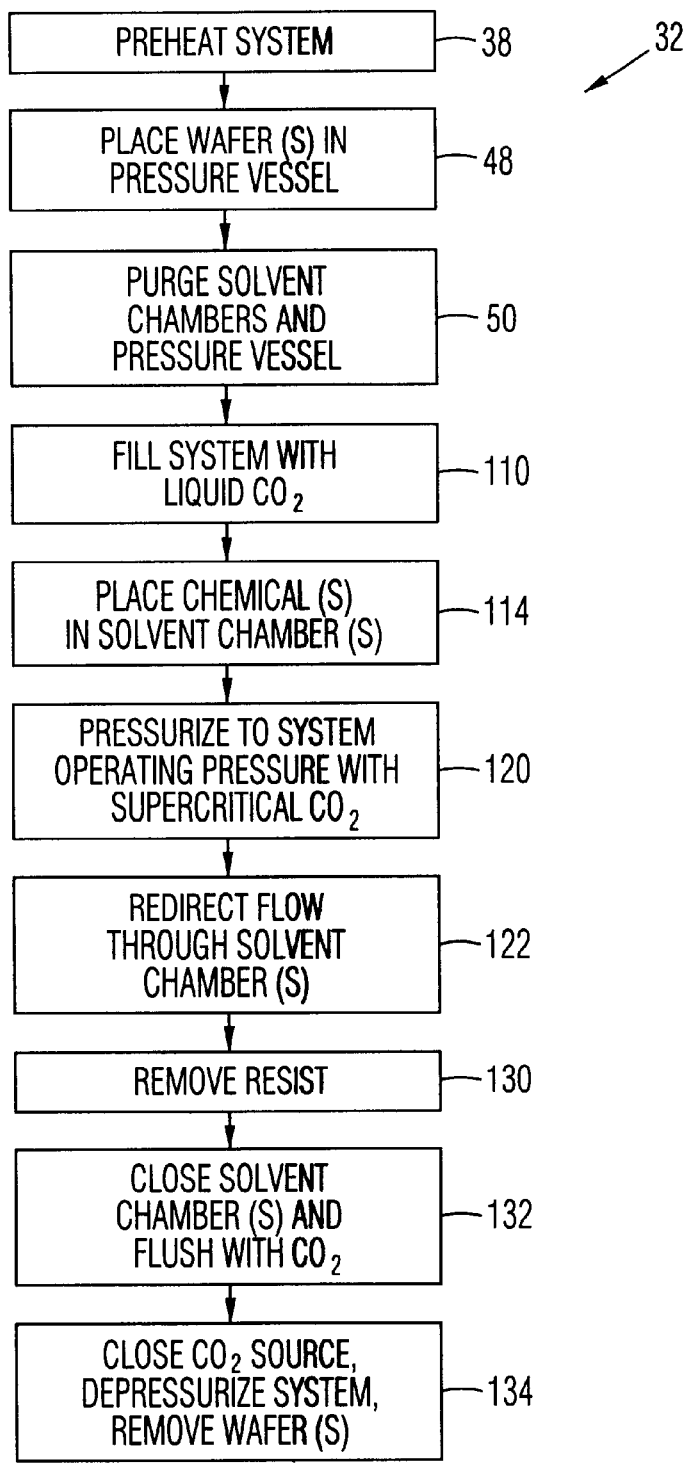
FIG. 3 is a flow diagram showing a simplified sequence of process steps of a resist removal system in accordance with the present invention.

FIG. 2 is a schematic diagram of a simplified resist removal system 30 of the present invention, and FIG. 3 is a flow diagram of a simplified resist removal process 32 according to the present invention. With reference to FIGS. 2 and 3, resist removal process 32 is preferably initiated by activating heat exchanger 34 to reduce the temperature of coolant flowing through cold trap 36. Then, system preheating step 38 brings pressure vessel 40, including wafer chamber 42, and solvent chambers 44 and 46 to a preferred operating temperature of 45 to 65° C. prior to the arrival of wafer 10. Skilled persons will appreciate that pressure vessel 40 may alternatively be maintained at a preferred processing temperature to facilitate throughput, or the temperature may be gradually increased from ambient temperature after wafer 10 enters pressure vessel 40 to reduce stress on wafer 10 or semiconductor devices or features 22 fabricated on wafer 10. Although electrical resistance heaters are preferably built into the walls of vessel 40 and chambers 44 and 46 to perform heating step 38, skilled persons will appreciate that other conventionally available heating techniques could be employed. Skilled persons will also appreciate that electrical resistance tape may be wrapped around all or some of the connecting lines, such as line 43 between pump 92 and vessel 40 and lines 45 and 47 between respective chambers 44 and 46 and line 43, to maintain the temperature of parts of system 30 at or near the temperature of vessel 40 and chambers 44 and 46.

Wafer placement step 48 employs manual or automatic conventional wafer handling techniques to place one or more wafers 10 into wafer chamber 42 in pressure vessel 40. Wafer(s) may be oriented horizontally or vertically and supported by clips, electrostatic or vacuum chucks, or other methods well known to skilled practitioners. Pressure vessel 40 may include one or more wafer airlocks, may comprise a gasket-mated two-piece vessel with a stationary portion and hydraullically raised and lowered portion, or may be sealed by other mechanisms.

Purging step 50 that purges solvent chambers 44 and 46 and pressure vessel 40 with fluid $CO_2$, preferably gaseous $CO_2$, preferably begins with all valves 60, 61, 62, 64, 66, 67, 68, 70, 72, 74, 76, 78, 80, 82, 84, 86, 87, and 88 in a closed position. $CO_2$ tank valve 60 is opened to allow fluid $CO_2$, preferably liquid $CO_2$, to flow from $CO_2$ tank 90 to pressure regulating valve 61 that ensures that the pressure is preferably greater than 750 pounds per square inch gauge pressure above ambient atmospheric pressure (psig). Vent valve 62 and pump valve 64 are preferably sequentially opened to allow $CO_2$ into pump 92 and through vent 94. Valve 66 allows compressed air from compressed air source 96 to reach pressure regulating valve 67 that is set to ensure a pressure of between 50 to 90 psig, and preferably 60 to 80 psig. $CO_2$ is allowed to flow out vent 94 by cycling pump 92 for preferably at least five seconds, prior to preferably sequentially opening valves 68, 70, 72, and 74 to purge solvent chamber 44; sequentially opening valves 76, 78, 80, and 82 to purge solvent chamber 46; and sequentially opening valves 84, 86, 88, and 87 to purge pressure vessel 40 through vent 98, cold trap 36, or exhaust 100.

To accomplish pressure vessel purging step 110, valves 88, 84, 78, 82, 74, and 70 are preferentially sequentially closed. The system pressure is then preferably adjusted to between 1,000 and 2,000 psig, and preferably between 1,000 and 1,500 psig by controlling the pumping rate at pressure regulating valve 61 and by adjusting the back pressure regulator 112. Back pressure regulator 112 is positioned between pressure vessel 40 and exhaust 100 and allows line 113 to be depressurized to ambient atmospheric pressure. The $CO_2$ system flow is also preferably set to between 0.5 and 20 liters per minute (LPM), and more preferably between 3 to 6 LPM.

After valves 70, 74, 78, and 82 are closed, solvents can be introduced in solvent chambers 44 and 46 through respective valves 72 and 80 to accomplish solvent chamber filling step 114. Valves 72 and 80 are subsequently closed before valves 74 and 82 are opened to allow solvent loops 116 and 118 to achieve the instantaneous system pressure. Skilled persons will appreciate that step 114 can be performed at any time after step 50 and before step 122 with the proper sequence of valve control.

Pressurizing system step 120 involves increasing the pressure of $CO_2$ in the system to between 2,000 to 6,000 psig, more preferably between 2,500 and 4,500 psig, and most preferably between 3,000 and 3,500 psig by adjusting back pressure valve 112. Other generally preferred conditions for the resist removal process of the present invention range from 10 to 80° C. and 750 to 6000 psig, and preferably from 40 to 70° C. and 1050 to 4500 psig. When the desired conditions are reached, valve 70 is opened and valve 68 is closed in solvent introduction step 122 to force the $CO_2$ stream to flow through solvent loop 116 and solvent chamber 44 to introduce a small amount of one or more chemicals into the supercritical $CO_2$ stream and into pressure vessel 40. The $CO_2$ flow rate may be reduced to 0.5 LPM, for example, to increase the chemical residence time in pressure vessel 40.

Preferred types of chemicals include: N-Methyl Pyrrolidone (NMP), diglycol amine, hydroxyl amine, tertiary amines, catechol, ammonium fluoride, ammonium bifluoride, methylacetoacetamide, ozone, propylene glycol monoethyl ether acetate, acetylacetone, dibasic esters, ethyl lactate, $CHF_3$, $BF_3$, other fluorine containing chemicals, or a mixture of any of the above chemicals. Optionally, one or more of these chemicals or mixture of chemicals may be introduced into system as described above from the same or a different solvent chamber(s) 44 and 46. Other chemicals such as an organic solvent may be used independently or added to one or more of the above chemicals to remove organic contaminants from the wafer surface. The organic solvent may include, for example, an alcohol, ether, and/or glycol, such as acetone, diacetone alcohol, dimethyl sulfoxide (DMSO), ethylene glycol, methanol, ethanol, propanol, or isopropanol (IPA). Although conventionally large amounts of chemicals can be used, applicant prefers to introduce each of these chemicals or mixtures of chemicals in an amount that is less than about 15% $v_c/v_v$, and preferably from 0.1 to 15% $v_c/v_v$, where $v_c$ is the liquid volume of the chemical and $v_v$ is the volume of pressure vessel 40. Preferably less than a few milliliters of chemicals are employed for each resist removal step 130; however, larger amounts can be used.

Resist removal step 130 allows the supercritical $CO_2$ to carry the solvents into pressure vessel 40 and into contact with the resist, residue, or other contaminants on wafer 10. The supercritical $CO_2$ can be recirculated through recirculation loop 133 to pressure vessel 40 until resist layer 20 is removed. Cold trap 36 removes chemicals from the depressurized $CO_2$ gas in line 113, and heat exchanger 34 along loop 133 cools the $CO_2$ to a liquid before it reaches pump 92. Resist removal step 130 is accomplished in preferably ten seconds to 15 minutes, and more preferably from 30 seconds to ten minutes, and most preferably from 30 seconds to three minutes. Valves 70 and 74 are closed and valve 68 is opened to bypass solvent chamber 44 for closing solvent chamber step 132.

In a preferred embodiment, a second set of solvent introduction, resist removal, and closing solvent chamber steps 122, 130, and 132 are performed in connection with solvent chamber 46. Valve 78 is opened and valve 76 is closed to force the $CO_2$ stream to flow through loop 118 and chamber 46 to introduce a second chemical or group of chemicals into the $CO_2$ stream and into pressure vessel 40. The second resist removal step 130 may employ the same or different chemical(s) employed in the first removal step 130 and may be conducted for a same or different time period. Then valves 82 and 78 are closed and valve 76 is opened to bypass solvent chamber 46. In an alternative most preferred embodiment, valve 136 is closed and valve 87 is open, and each set of steps 122, 130, and 132 is performed in ten seconds to one minute without solvent recirculation. A 2.5 $\mu$m-thick resist layer 20 can be removed from the surface of an 6", 8" or 300 mm diameter wafer 10 with two removal steps 130 of less than 30 seconds each. Thus, each wafer 10 or group of wafers 10 can be processed in less than one minute.

Pressure vessel 40 is then flushed for five to thirty seconds, preferably 10 seconds, with supercritical $CO_2$ and/or liquid $CO_2$ to remove all traces of remaining chemicals. Finally, pressure vessel 40 is depressurized in step 134 by closing valves 66 and 60 and opening valves 62, 74, 82, 84, and 87 to vent the system to atmosphere.

Skilled persons will appreciate that system 30 preferably includes one directional check values 142, 144, 146, 148, 150, and 151 to ensure the direction of flow indicated in the flow lines of FIG. 2. Skilled persons will also appreciate that system 30 preferably includes pressure gauges 152, 154, 156, 158, 160, 162, and 164 that may be monitored so that pump 92 or back pressure regulating values may be adjusted manually or by computer as needed.

Figure 4:
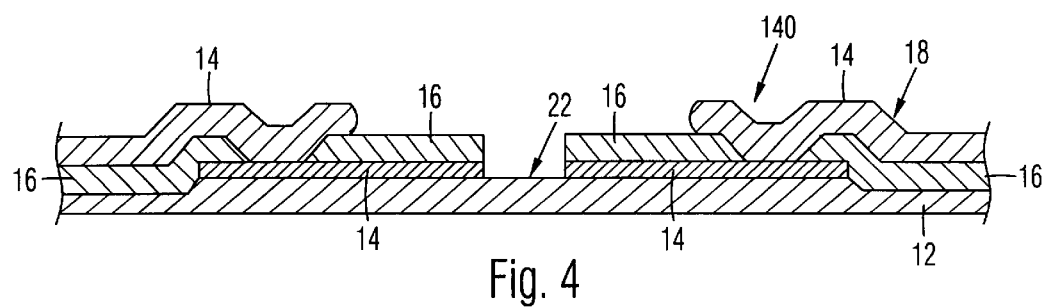
FIG. 4 is a fragmentary cross-sectional view of the wafer of FIG. 4 subsequent to a resist removal step in accordance with the present invention.

FIG. 4 is a fragmentary cross sectional view showing wafer 140 following step 134 without resist layer 20. For convenience, certain features of FIG. 4 that correspond to features of FIG. 1 have been designated with the same reference numbers. With reference to FIG. 4, wafer(s) 140 are then preferably removed and rinsed with deionized (DI) or ultra pure water to finish the cleaning process.

FIG. 5 presents a table showing a few examples of tests performed to remove photoresist from a wafer 10. Electron micrographs of wafers 10 subjected to these trials exhibited surfaces of resulting stripped wafers 140 that were substantially free of photoresist or its residues.

Skilled persons will appreciate that the method of the present invention eliminates the requirement for a carbonizing or ashing process prior to resist removal, substantially reducing the cost, equipment, and process time conventionally needed for resist removal.

Skilled persons will also appreciate that the method of the present invention outperforms conventional resist removal processes to the extent that it eliminates the need for a conventional post-stripping cleaning step such as a "piranha" bath employing hazardous chemicals. Furthermore, the relatively small amount of chemicals utilized by the method of the present invention offers tremendous cost savings over conventional techniques and chemical baths Finally, the method of the present invention facilitates increased wafer throughput.

It will be obvious to those having skill in the art that many changes may be made to the details of the above-described embodiment of this invention without departing from the underlying principles thereof. The scope of the present invention should, therefore, be determined only by the following claims.

What is claimed is:

1. A method of processing a semiconductor wafer having a surface supporting resist comprising the steps of:
   exposing the resist to supercritical $CO_2$ in combination with a first solvent, the first solvent being selected from the group consisting of n-methyl pyrrolidone, di-isopropyl amine, tri-isopropyl amine, diglycol amine, hydroxyl amine, and a mixture thereof; and
   maintaining the supercritical carbon dioxide and the first solvent in contact with the resist until substantially all of the resist has been removed from the surface of the wafer.

2. The method of claim 1 further comprising the steps of:
   heating a process chamber;
   placing the wafer having the surface supporting resist in the process chamber prior to exposing the resist to the supercritical carbon dioxide;
   pressurizing the process chamber with $CO_2$ prior to exposing the resist to the supercritical carbon dioxide and the first solvent; and
   flushing the process chamber with the supercritical $CO_2$ subsequent to exposing the resist to the supercritical $CO_2$ and the first solvent in order to remove the resist and the first solvent from the process chamber.

3. The method of claim 2 wherein the process chamber is pressurized to a pressure between about 1050 and 6000 psig.

4. The method of claim 3 wherein the process chamber is pressurized to a pressure between about 2500 and 4500 psig.

5. The method of claim 3 wherein the process chamber is heated to a temperature between about 20 to and 80° C.

6. The method of claim 5 wherein the process chamber is heated to a temperature between about 46 and 70° C.

7. The method of claim 2 wherein the process chamber is heated to a temperature greater than about 46° C. and less than about 80° C.

8. The method of claim 1 wherein a ratio of the first solvent to the combination of the supercritical $CO_2$ and the first solvent is less than 15% by volume.

9. The method of claim 1 further comprising the step of adding a second solvent to the combination of the supercritical $CO_2$ and the first solvent.

10. The method of claim 9 wherein a ratio of the first and second solvents to the combination of the supercritical carbon dioxide and the first and second solvents is less than 15% by volume.

11. The method of claim 1 further comprising the step of removing organic contaminants from the wafer surface.

12. The method of claim 11 further comprising the step of adding an organic solvent to the combination of the supercritical $CO_2$ and the first solvent.

13. The method of claim 12 wherein the organic solvent is selected from the group consisting of alcohols, ethers, and glycols.

14. The method of claim 1 wherein a time period for maintaining the supercritical $CO_2$ and the first solvent in contact with the wafer having the surface supporting resist is between 10 seconds and 15 minutes.

15. The method of claim 14 wherein the time period is less than about 5 minutes.

16. The method of claim 15 wherein the time period is less than about one minute.

17. The method of claim 2 further comprising the step of adding liquid $CO_2$ to the pressure chamber subsequent to pressurizing the process chamber with the $CO_2$ and prior to introducing the supercritical $CO_2$ and the first solvent to the pressure chamber.

18. The method of claim 2 wherein the wafer is placed in the process chamber prior to heating the process chamber.

19. The method of claim 1 wherein the wafer surface includes feature sizes of less than 0.5 $\mu$m.

20. The method of claim 1 wherein the wafer surface includes one or more vias having a depth to diameter aspect ratio that is greater than 5:1.

21. The method of claim 1 wherein a thickness of the resist is greater than 1.5 $\mu$m.

22. The method of claim 1 wherein the resist comprises a photoresist.

23. The method of claim 1 further comprising the step of adding a fluorine-containing chemical to the combination of the supercritical $CO_2$ and the first solvent.

24. The method of claim 1 further comprising the step of adding a 3 to 6 carbon dione to the combination of the supercritical $CO_2$ and the first solvent.

25. The method of claim 24 wherein the first solvent includes the n-methyl pyrrolidone.

26. A method of processing a semiconductor wafer having a surface supporting resist comprising the steps of:
exposing the resist to supercritical $CO_2$ in combination with a first solvent at a pressure greater than or equal to 1,050 psig and less than or equal to 6,000 psig, the first solvent being selected from the group consisting of n-methyl pyrrolidone, di-isopropyl amine, tri-isopropyl amine, diglycol amine, hydroxyl amine, and a mixture thereof; and
maintaining the supercritical carbon dioxide and the first solvent in contact with the resist until substantially all of the resist has been removed from the surface of the wafer.

27. A method of processing a semiconductor wafer having a surface supporting resist comprising the steps of:
exposing the resist to supercritical $CO_2$ in combination with a first solvent at a temperature greater than or equal to 46° C. and less than or equal to 80° C., the first solvent being selected from the group consisting of n-methyl pyrrolidone, di-isopropyl amine, tri-isopropyl amine, diglycol amine, hydroxyl amine, and a mixture thereof; and
maintaining the supercritical carbon dioxide and the first solvent in contact with the resist until substantially all of the resist has been removed from the surface of the wafer.

28. A method of processing a semiconductor wafer having a surface supporting resist comprising the steps of:
exposing the resist to supercritical $CO_2$ in combination with n-methyl pyrrolidone; and
maintaining the supercritical carbon dioxide and the n-methyl pyrrolidone in contact with the resist until substantially all of the resist has been removed from the surface of the wafer.

29. The method of claim 28 wherein a ratio of the n-methyl pyrrolidone to the combination of the supercritical carbon dioxide and the n-methyl pyrrolidone is between 0.1 and 15% by volume.

30. A method of processing a semiconductor wafer having a surface supporting resist residue comprising the steps of:
exposing the resist residue to supercritical $CO_2$ in combination with a first solvent, the first solvent being selected from the group consisting of n-methyl pyrrolidone, di-isopropyl amine, tri-isopropyl amine, diglycol amine, hydroxyl amine, and a mixture thereof; and
maintaining the supercritical carbon dioxide and the first solvent in contact with the resist residue until substantially all of the resist residue has been removed from the surface of the wafer.

31. The method of claim 30 further comprising the steps of:
heating a process chamber;
placing the wafer having the surface supporting resist residue in the process chamber prior to exposing the resist residue to the supercritical carbon dioxide;
pressurizing the process chamber with $CO_2$ prior to exposing the resist residue to the supercritical carbon dioxide and the first solvent; and
flushing the process chamber with the supercritical $CO_2$ subsequent to exposing the resist residue to the supercritical $CO_2$ and the first solvent in order to remove the resist residue and the first solvent from the process chamber.

32. The method of claim 31 wherein the process chamber is pressurized to a pressure between about 1050 and 6000 psig.

33. The method of claim 32 wherein the process chamber is pressurized to a pressure between about 2500 and 4500 psig.

34. The method of claim 32 wherein the process chamber is heated to a temperature between about 20 and 80° C.

35. The method of claim 34 wherein the process chamber is heated to a temperature between about 46 and 70° C.

36. The method of claim 31 wherein the process chamber is heated to a temperature greater than about 46° C. and less than about 80° C.

37. The method of claim 30 wherein a ratio of the first solvent to the combination of the supercritical $CO_2$ and the first solvent is less than 15% by volume.

38. The method of claim 30 further comprising the step of adding a second solvent to the combination of the supercritical $CO_2$ and the first solvent.

39. The method of claim 38 wherein a ratio of the first and second solvents to the combination of the supercritical carbon dioxide and the first and second solvents is less than 15% by volume.

40. The method of claim 30 further comprising the step of removing organic contaminants from the wafer surface.

41. The method of claim 40 further comprising the step of adding an organic solvent to the combination of the supercritical $CO_2$ and the first solvent.

42. The method of claim 41 wherein the organic solvent is selected from the group consisting of alcohols, ethers, and glycols.

43. The method of claim 30 wherein a time period for maintaining the supercritical $CO_2$ and the first solvent in contact with the wafer having the surface supporting resist residue is between 10 seconds and 15 minutes.

44. The method of claim 43 wherein the time period is less than about 5 minutes.

45. The method of claim 44 wherein the time period is less than about one minute.

46. The method of claim 31 further comprising the step of adding liquid $CO_2$ to the pressure chamber subsequent to pressurizing the process chamber with the $CO_2$ and prior to introducing the supercritical $CO_2$ and the first solvent to the pressure chamber.

47. The method of claim 31 wherein the wafer is placed in the process chamber prior to heating the process chamber.

48. The method of claim 30 wherein the wafer surface includes feature sizes of less than 0.5 $\mu$m.

49. The method of claim 30 wherein the wafer surface includes one or more vias having a depth to diameter aspect ratio that is greater than 5:1.

50. The method of claim 30 wherein the resist residue comprises a photoresist residue.

51. The method of claim 30 further comprising the step of adding a fluorine-containing chemical to the combination of the supercritical $CO_2$ and the first solvent.

52. The method of claim 30 further comprising the step of adding a 3 to 6 carbon dione to the combination of the supercritical $CO_2$ and the first solvent.

53. The method of claim 52 wherein the first solvent includes the n-methyl pyrrolidone.

54. A method of processing a semiconductor wafer having a surface supporting resist residue comprising the steps of:
exposing the resist residue to supercritical $CO_2$ in combination with a first solvent at a pressure greater than or equal to 1,050 psig and less than or equal to 6,000 psig, the first solvent being selected from the group consisting of n-methyl pyrrolidone, di-isopropyl amine, tri-isopropyl amine, diglycol amine, hydroxyl amine, and a mixture thereof; and maintaining the supercritical carbon dioxide and the first solvent in contact with the resist residue until substantially all of the resist residue has been removed from the surface of the wafer.

55. A method of processing a semiconductor wafer having a surface supporting resist residue comprising the steps of:

exposing the resist residue to supercritical $CO_2$ in combination with a first solvent at a temperature greater than or equal to 46° C. and less than or equal to 80° C., the first solvent being selected from the group consisting of n-methyl pyrrolidone, diisopropyl amine, triisopropyl amine, diglycol amine, hydroxyl amine, and a mixture thereof; and maintaining the supercritical carbon dioxide and the first solvent in contact with the resist residue until substantially all of the resist residue has been remove from the surface of the wafer.

56. A method of processing a semiconductor wafer having a surface supporting resist residue comprising the steps of:

exposing the resist residue to supercritical $CO_2$ in combination with n-methyl pyrrolidone; and maintaining the supercritical carbon dioxide and the n-methyl pyrrolidone in contact with the resist residue until substantially all of the resist residue has been removed from the surface of the wafer.

57. The method of claim 56 wherein a ratio of the n-methyl pyrrolidone to the combination of the supercritical carbon dioxide and the n-methyl pyrrolidone is between 0.1 and 15% by volume.

* * * * *

UNITED STATES PATENT AND TRADEMARK OFFICE
CERTIFICATE OF CORRECTION

PATENT NO. : 6,306,564 B1
DATED : October 23, 2001
INVENTOR(S) : William H. Mullee It is certified that error appears in the above-identified patent and that said Letters Patent is hereby corrected as shown below:

Column 6,
Line 62, after "solvent" and before ".", please add -- , wherein the fluorine containing chemical is selected from the group consisting of ammonium fluride, ammonium bifluoride, $CHF_3$, and $BF_3$ --.

Column 8,
Line 53, after "solvent" and before ".", please add -- , wherein the fluorine containing chemical is selected from the group consisting of ammonium fluride, ammonium bifluoride, $CHF_3$ and $BF_3$ --.

Signed and Sealed this

Twentieth Day of July, 2004

JON W. DUDAS
*Acting Director of the United States Patent and Trademark Office*